US 9,490,658 B2

(12) United States Patent
Wei et al.

(10) Patent No.: US 9,490,658 B2
(45) Date of Patent: Nov. 8, 2016

(54) APPARATUS AND A METHOD OF MANUFACTURING AN APPARATUS

(75) Inventors: Di Wei, Cambridgeshire (GB); Piers Andrew, Cambridge (GB); Teuvo Tapani Ryhänen, Cambridge (GB)

(73) Assignee: Nokia Technologies Oy, Espoo (FI)

( * ) Notice: Subject to any disclaimer, the term of this patent is extended or adjusted under 35 U.S.C. 154(b) by 572 days.

(21) Appl. No.: 13/315,489

(22) Filed: Dec. 9, 2011

(65) Prior Publication Data

US 2013/0147420 A1 Jun. 13, 2013

(51) Int. Cl.

| | |
|---|---|
| *H01M 10/44* | (2006.01) |
| *H02J 7/35* | (2006.01) |
| *H02S 40/38* | (2014.01) |
| *H01M 12/00* | (2006.01) |
| *H01M 14/00* | (2006.01) |
| *H01L 31/053* | (2014.01) |
| *H02J 7/34* | (2006.01) |
| *H01M 4/13* | (2010.01) |

(52) U.S. Cl.
CPC ............ *H02J 7/355* (2013.01); *H01L 31/053* (2014.12); *H01M 12/00* (2013.01); *H01M 14/005* (2013.01); *H02S 40/38* (2013.01); *H01M 4/13* (2013.01); *H02J 7/345* (2013.01); *Y02E 10/50* (2013.01)

(58) Field of Classification Search
CPC .......... H02S 40/38; H02S 40/00; H02J 7/35; H02J 7/355; Y02E 60/12; H01M 10/465; H01M 16/006
USPC ........................................................ 320/101
See application file for complete search history.

(56) References Cited

U.S. PATENT DOCUMENTS

| | | | | |
|---|---|---|---|---|
| 6,194,119 | B1* | 2/2001 | Wolk et al. .................. 430/200 |
| 6,682,677 | B2* | 1/2004 | Lobovsky ............. B82Y 30/00 264/11 |
| 6,936,994 | B1* | 8/2005 | Gimlan .................. B60L 8/003 320/101 |
| 7,842,432 | B2* | 11/2010 | Niu .......................... H01B 1/04 429/512 |
| 8,094,247 | B2* | 1/2012 | Allemand ............. B82Y 10/00 349/12 |
| 8,206,838 | B2* | 6/2012 | Marrocco, III .......... C08K 3/24 252/301.35 |
| 9,029,083 | B2* | 5/2015 | Griffiths et al. ............... 435/6.1 |
| 2005/0126623 | A1* | 6/2005 | Rogler et al. ................. 136/253 |
| 2007/0099062 | A1* | 5/2007 | Leonida ......................... 429/38 |
| 2008/0057355 | A1 | 3/2008 | Ajiki ................................ 429/9 |
| 2009/0078307 | A1 | 3/2009 | Segawa et al. ............... 136/252 |
| 2009/0183994 | A1* | 7/2009 | Misra et al. .................. 205/340 |

(Continued)

FOREIGN PATENT DOCUMENTS

| | | |
|---|---|---|
| CN | 102066243 A | 5/2011 |
| JP | 2002042863 A | 2/2002 |

(Continued)

OTHER PUBLICATIONS

Michael Gratzel, Dye-sensitized solar cells, Jun. 3, 2003, Journal of Photochemistry and Photobiology C: Photochemistry Reviews 4 (2003) pp. 145-153.*

(Continued)

*Primary Examiner* — M'Baye Diao
(74) *Attorney, Agent, or Firm* — Harrington & Smith

(57) ABSTRACT

An apparatus including a charge storage component; and an energy harvesting component wherein the charge storage component and the energy harvesting component are integrated via a common electrode.

18 Claims, 2 Drawing Sheets

(56) References Cited

U.S. PATENT DOCUMENTS

| | | | |
|---|---|---|---|
| 2010/0117859 A1* | 5/2010 | Mitchell et al. | 340/870.16 |
| 2010/0315035 A1* | 12/2010 | Belov et al. | 320/101 |
| 2011/0156532 A1* | 6/2011 | Churchill et al. | 310/319 |
| 2011/0210554 A1* | 9/2011 | Boysel | 290/50 |
| 2011/0232761 A1 | 9/2011 | Lomasney | 136/262 |

FOREIGN PATENT DOCUMENTS

| | | |
|---|---|---|
| JP | 2005116324 A | 4/2005 |
| KR | 2011-0077716 A | 7/2011 |
| WO | WO-2010118375 A2 | 10/2010 |
| WO | WO-2011021982 A1 | 2/2011 |

OTHER PUBLICATIONS

Michael Gratzel, COnversion of sunlight to electric power by nanocrystalline dye-sensitized solar cells, Nov. 25, 2003, Journal of Photochemistry and Photobiology A: Chemistry 164 (2004) 3-14.*

Highly Efficient Dye-Sensitized Solar Cells with a Titania Thin Film Electrode composed of a Network Structure of Single-Crystal-Like TiO2 Nanowires made by the "Oriented Attachment" Mechanism, Adachi et al., JACS Articles, Oct. 23, 2004, 14944 J. Am. Chem. Soc. vol. 126, No. 45, 2004.*

Notten, et al., "3-D Integrated All-Solid-State Rechargeable Batteries", (2007), (pp. 4564-4567).

Lee, et al., "Highly Ordered Nanoporous Template from Triblock Copolymer", vol. 5, No. 2, (2011), (pp. 1207-1214).

Pushparaj, et al., "Flexible Energy Storage Devices Based on Nanocomposite Paper", vol. 104, No. 34, (2007), pp. 13574-13577).

Baggetto, et al., "High Energy Density All-Solid-State Batteries: A Challenging Concept Towards 3D Integration", (2008), (pp. 1057-1066).

Cheah et al., "Self-Supported Three-Dimensional Nanoelectrodes for Microbattery Applications", American Chemical Society, (2009), (pp. 3230-3233).

Long et al., "Three-Dimensional Battery Architectures", (2004), (pp. 4463-4492).

* cited by examiner

APPARATUS AND A METHOD OF MANUFACTURING AN APPARATUS

TECHNOLOGICAL FIELD

Embodiments of the present invention relate to an apparatus and a method of manufacturing an apparatus. In particular, they relate to an apparatus that is capable of harvesting energy and storing energy.

BACKGROUND

It would be useful to provide an apparatus that is capable of harvesting energy and storing energy.

BRIEF SUMMARY

According to various, but not necessarily all, embodiments of the invention there is provided an apparatus comprising: a charge storage component; and an energy harvesting component wherein the charge storage component and the energy harvesting component are integrated via a common electrode.

According to various, but not necessarily all, embodiments of the invention there is provided a method of manufacturing an apparatus comprising: forming a charge storage component on a first side of a common electrode; and forming an energy harvesting component on a second side of a common electrode, opposing the first side.

BRIEF DESCRIPTION

For a better understanding of various examples of embodiments of the present invention reference will now be made by way of example only to the accompanying drawings in which:

FIG. 1 schematically illustrates a hybrid apparatus that integrates a charge storage component and an energy harvesting component;

Figure 4A:
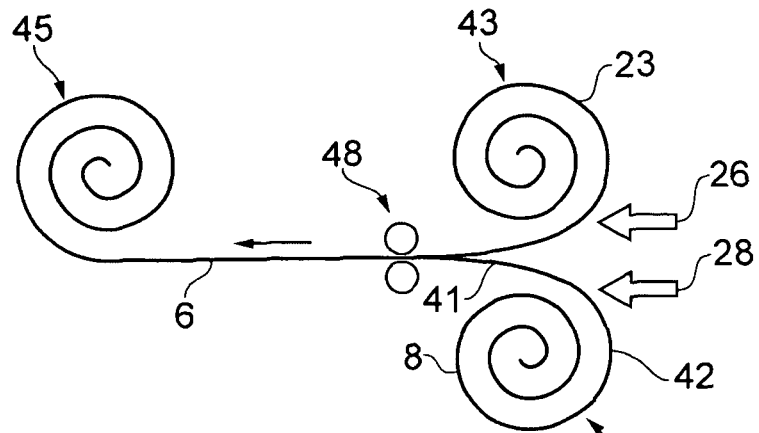
Figure 4B:
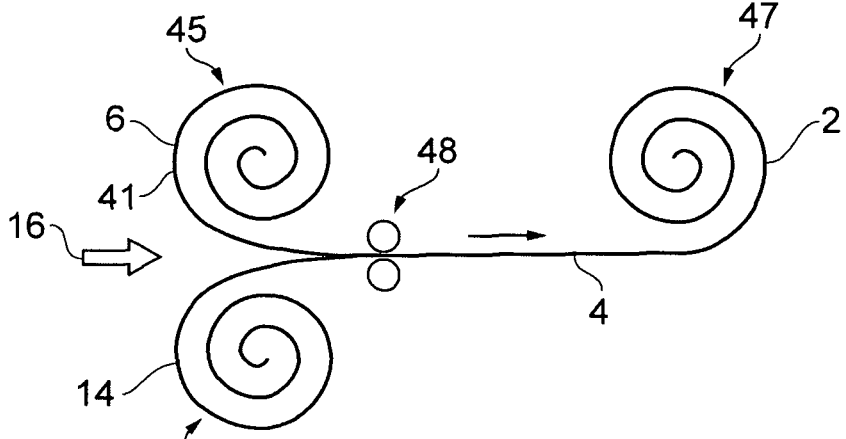
Figure 5:
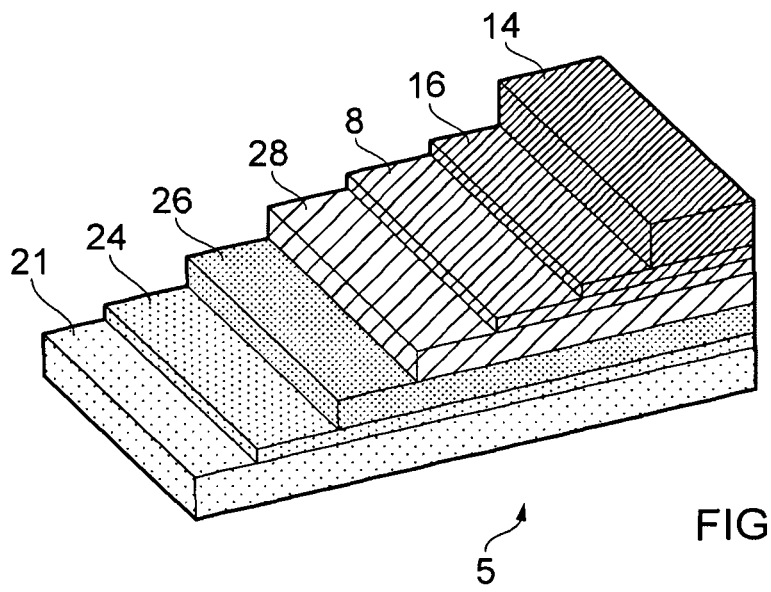

FIGS. 4A and 4B schematically illustrate a process for manufacturing the hybrid apparatus; and FIG. 5 illustrates a cut-away illustration of the manufactured hybrid apparatus.

DETAILED DESCRIPTION

The Figures illustrate an apparatus 2 comprising: a charge storage component 4; and an energy harvesting component 6 wherein the charge storage component 4 and the energy harvesting component 6 are integrated via a common electrode 8.

Figure 1:
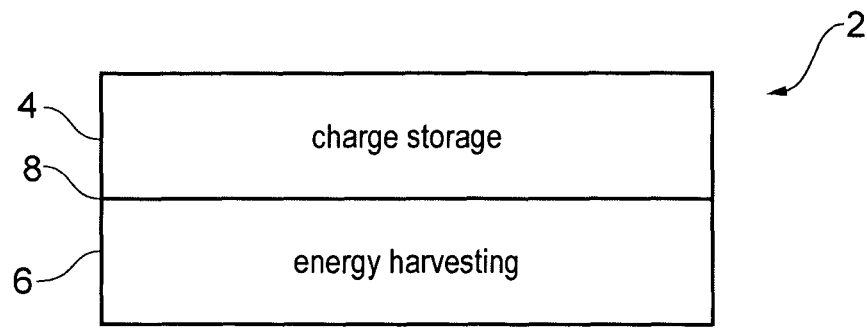

FIG. 1 schematically illustrates an apparatus 2 comprising: a charge storage component 4; and an energy harvesting component 6. The apparatus 2 is a hybrid apparatus that integrates the charge storage component 4 and the energy harvesting component 6 in a single whole entity, the apparatus 2.

The charge storage component 4 and the energy harvesting component 6 are integrated via a common electrode 8. The common electrode 8 forms a separator between the charge storage component 4 and the energy harvesting component 6. The single common electrode 8 operates both as an anode electrode of the charge storage component 4 and as a cathode electrode of the energy harvesting component 6. The charge storage component 4 may be an electrochemical energy storage component 10 such as a battery or an electro-static energy storage component such as a capacitor. The charge storage component 4 may be a supercapacitor.

Figure 2:
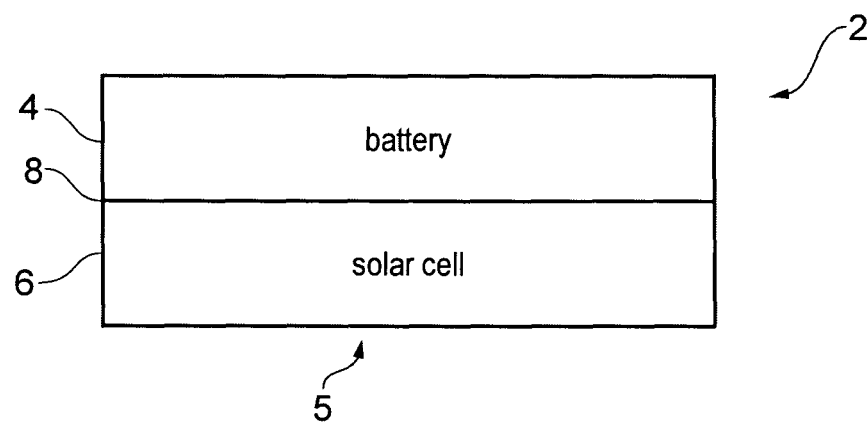
FIG. 2 illustrates an example of the hybrid apparatus where the charge storage component is a battery and the energy harvesting component is a solar cell.

FIG. 2 illustrates an example of an apparatus 2 where the charge storage component 4 is a battery 10 and where the energy harvesting component 6 is a solar cell.

The common electrode 8 is configured to operate as an anode of the battery 4 and a cathode of the solar cell 6.

The solar cell 6 comprises a semiconductor that transports photo-excited electrons to the common electrode 8 to charge the battery 4. For example, the solar cell 6 may be a silicon solar cell or a dye sensitized solar cell.

Figure 3:
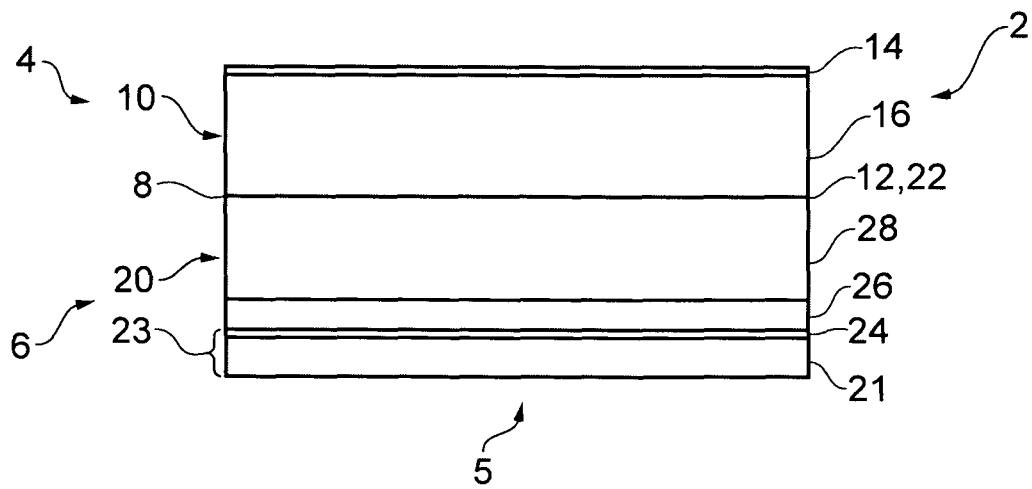
FIG. 3 illustrates an example of the hybrid apparatus where the charge storage component is a lithium-ion battery and the energy harvesting component is a dye sensitized solar cell.

FIG. 3 illustrates an example of an apparatus 2 where the battery 4 is a lithium-ion battery 10 and the solar call 6 is a dye sensitized solar cell 20. The apparatus 2 is flexible. It can be bent or flexed.

In this example, the common electrode 8 may comprise lithium metal or conducting nanocarbon or some other material that is suitable for forming an anode 12 of a lithium-ion battery and a cathode 22 of a solar cell 6.

The solar cell 6 is a dye sensitized solar cell is based upon a $TiO_2$ and iodide system. The dye sensitized solar cell 6 is flexible and comprises, in order, an external flexible transparent electrode 23; a semiconductor 26; a solar cell electrolyte 28 and then the common electrode 8.

The external flexible transparent electrode 23 comprises a flexible transparent substrate 21 coated on its interior surface with transparent conductive material 24.

The substrate 21 may for example be formed from polyethylene terephthalate (PET).

The conductive material 24 may, for example, comprise fluorine doped tin oxide (FTO); indium tin oxide (ITO) or graphene.

The semiconductor 26, in this example, comprises a nanocrystalline semiconductor and dye, for example $TiO_2$ nanostructures coated with dye. The nanostructures may provide spaces that retain dye molecules. The dye is a molecular dye that absorbs sunlight such as, for example, ruthenium-polypyridine The $TiO_2$ nanostructures may, for example be an array of $TiO_2$ nanotubes or may comprise brush nanostructured $TiO_2$ on conducting carbon fibres.

The solar cell electrolyte 28 comprises iodide cations. It may, for example, be a polymer electrolyte comprising lithium iodide. A physical separator layer may be positioned between the common electrode 8 and the semiconductor 26 to prevent electrical shorts but enable diffusion of the electrolyte 28.

The charge storage component 4 is a flexible lithium-ion battery 10. It comprises the common electrode 8, a battery electrolyte 16 comprising lithium anions and a battery cathode electrode 14 comprising a compound lithium oxide.

The common electrode 8 is configured to operate as an anode 12 of the lithium-ion battery 10. The common electrode 8 may, for example, comprise lithium metal or conducting nanocarbon.

In use light 5, for example sunlight passes through the external flexible transparent electrode 23 into the dye of the semiconductor layer 26 where an electrons are photo-excited. Photons striking the dye with enough energy to be absorbed create a photo-excited state of the dye. Charge separation occurs at the surfaces between the dye and semiconductor when the photo-excited electrons leave the dye and enter the conduction band of the $TiO_2$ semiconductor layer 26. The electrons flow from the $TiO_2$ semiconductor layer 26 to the external flexible transparent electrode 23.

Some of the dye molecules have lost an electron. These oxidized dye molecules oxidize the iodide in the electrolyte by taking electrons and changing its oxidation state from iodide to tri-iodide. This reaction occurs quickly compared to the time that it takes for an electron injected into the conduction band of the $TiO_2$ semiconductor layer 26 to recombine with the oxidized dye molecule.

The tri-iodide diffuses to the common electrode 8 to strip an electron from the lithium-ion battery 10.

The stripping of electrons from the common electrode 8 of the lithium-ion battery 10 results in the donation of electrons to the electrolyte 16 by the battery cathode 14. The donated electrons migrate to the battery anode 12 (common electrode 8) where they cause intercalation of lithium ions (charging of the lithium-ion battery 10).

FIGS. 4A and 4B schematically illustrate a process for forming the apparatus 2.

A charge storage component 4 is formed on a first side 41 of the common electrode 8 and an energy harvesting component 6 is formed on a second side 42 of the common electrode 8, opposing the first side 41.

In this example, the charge storage component 4 is a lithium-ion battery 10 and the solar call 6 is a dye sensitized solar cell 20. The apparatus 2 is flexible. It can be bent or flexed.

FIG. 4A schematically illustrates a process used to form an energy harvesting component 6 on a second side 42 of the common electrode 8. A transparent electrode 23 has a semiconductor layer 26 applied to its conductive side. The common electrode 8 has electrolyte 28 applied to its second side 42.

The transparent electrode 23 (with semiconductor layer 26) and the common electrode 8 (with electrolyte 28) are positioned such that the semiconductor layer 26 faces and contacts the electrolyte 28. Contact may be formed by passing the transparent electrode 23 (with semiconductor layer 26) and the common electrode 8 (with electrolyte 28) through opposing rollers 48 which press the transparent electrode 23 (with semiconductor layer 26) and the common electrode 8 (with electrolyte 28) together.

This process lends itself to roll-to-roll manufacture. A roll 43 of the transparent electrode may be combined with a roll 44 of the common electrode 8 to form a roil 45 of the energy harvesting component 6.

FIG. 4A schematically illustrates a process used to form a charge storage component 4 on a first side 41 of the common electrode 8. A battery electrolyte 16 is applied between a battery cathode electrode 14 and the first side 41 of the common electrode 8. Contact may be formed by passing the combination of battery cathode electrode 14, common electrode 8 and battery electrolyte 16 through opposing rollers 48 which press the battery cathode electrode 14 and common electrode 8 together.

This process lends itself to roll-to-roll manufacture. A roll 46 of the battery cathode electrode 14 is combined with a roll 45 of the common electrode 8 formed according to FIG. 4A.

It will be appreciated that FIGS. 4A and 4B illustrate a two-stage process in which the energy harvesting component 6 is first manufactured and then the charge storage component 4 is added to the energy harvesting component 6 to form the hybrid apparatus 2. However, in other embodiments, the two-stage process may be reversed. In this case, the charge storage component 4 is first manufactured and then the energy harvesting component 6 is added to the charge storage component 4 to form the hybrid apparatus 2.

FIG. 5 illustrates a cut-away illustration of an apparatus 2, for example, as formed using the method of FIGS. 4A and 4B. The apparatus 2 comprises: an external flexible transparent electrode layer 23; a semiconductor layer 26; a solar cell electrolyte layer 28; the common electrode layer 8; battery electrolyte layer 16 and a battery cathode electrode layer 14.

Although embodiments of the present invention have been described in the preceding paragraphs with reference to various examples, it should be appreciated that modifications to the examples given can be made without departing from the scope of the invention as claimed.

Features described in the preceding description may be used in combinations other than the combinations explicitly described.

Although functions have been described with reference to certain features, those functions may be performable by other features whether described or not.

Although features have been described with reference to certain embodiments, those features may also be present in other embodiments whether described or not.

Whilst endeavoring in the foregoing specification to draw attention to those features of the invention believed to be of particular importance it should be understood that the Applicant claims protection in respect of any patentable feature or combination of features hereinbefore referred to and/or shown in the drawings whether or not particular emphasis has been placed thereon.

We claim:

1. An apparatus comprising:
    a charge storage component; and
    an energy harvesting component;
    wherein the charge storage component and the energy harvesting component are integrated via a common electrode;
    wherein the energy harvesting component comprises a nanocrystalline semiconductor; and
    wherein the nanocrystalline semiconductor comprises $TiO_2$ nanostructures and dye; and
    wherein the $TiO_2$ nanostructures comprise brush nanostructured $TiO_2$ on conducting carbon fibres.

2. An apparatus as claimed in claim 1, wherein the common electrode forms a separator between the charge storage component and the energy harvesting component and wherein the common electrode operates as an electrode of the charge storage component and as an electrode of the energy harvesting component.

3. An apparatus as claimed in claim 1, wherein the common electrode comprises a material selected from the group comprising: lithium metal and conducting nonocarbon.

4. An apparatus as claimed in claim 1, wherein the charge storage component is selected from the group comprising: an electrochemical energy storage component and a supercapacitor.

5. An apparatus as claimed in claim 1, wherein the charge storage component is a lithium-ion battery and the common electrode is configured to operate as an anode of the lithium-ion battery.

6. An apparatus as claimed in claim 5, wherein the energy harvesting component is a solar cell.

7. An apparatus as claimed in claim 1, wherein the energy harvesting component is a dye sensitized solar cell.

8. An apparatus as claimed in claim 7, wherein the dye sensitized solar cell is based upon a $TiO_2$ and iodide system.

9. An apparatus as claimed in claim 1, wherein the energy harvesting component comprises:
a transparent electrode;
the common electrode;
and an electrolyte between the nanocrystalline semiconductor and the common electrode.

10. An apparatus as claimed in claim 9, wherein the electrolyte comprises iodide cations.

11. An apparatus as claimed in claim 9, wherein the transparent electrode comprises a coated flexible substrate and the energy harvesting component is flexible.

12. An apparatus as claimed in claim 1, wherein the charge storage component comprises the common electrode, an electrolyte comprising lithium anions and an electrode comprising a lithium oxide wherein the charge storage component is flexible.

13. A method of manufacturing an apparatus comprising:
forming a charge storage component on a first side of a common electrode; and
forming an energy harvesting component on a second side of a common electrode, opposing the first side, wherein the energy harvesting component comprises a nanocrystalline semiconductor; and
wherein the nanocrystalline semiconductor comprises $TiO_2$ nanostructures and dye; and
wherein the $TiO_2$ nanostructures comprise brush nanostructured $TiO_2$ on conducting carbon fibres.

14. A method as claimed in claim 13, comprising: forming an energy harvesting component on a second side of the common electrode by positioning a transparent electrode comprising nanocrystalline semiconductor layer such that the semiconductor layer faces the second side of the common electrode.

15. A method as claimed in claim 14, comprising: applying an electrolyte to the second side of the common electrode before positioning the transparent electrode, such that when the transparent electrode is positioned the electrolyte and the semiconductor contact.

16. A method as claimed in claim 14, wherein the energy harvesting component is formed by roll to roll manufacturing, wherein a roll of transparent electrode comprising nanocrystalline semiconductor layer is combined with a roll of the common electrode.

17. A method as claimed in claim 13, comprising: forming a charge storage component on the first side of the common electrode by positioning an outer electrode facing the first side of the common electrode with an intervening electrolyte between the outer electrode and the common electrode.

18. A method as claimed in claim 17, wherein the electrolyte of the charge storage component comprises lithium anions and the outer electrode of the charge storage component comprises a lithium oxide.

* * * * *

UNITED STATES PATENT AND TRADEMARK OFFICE
CERTIFICATE OF CORRECTION

PATENT NO.         : 9,490,658 B2
APPLICATION NO.    : 13/315489
DATED              : November 8, 2016
INVENTOR(S)        : Di Wei, Piers Andrew and Teuvo Tapani Ryhanen It is certified that error appears in the above-identified patent and that said Letters Patent is hereby corrected as shown below:

In the Claims

In Claim 3:

Column 4, Line 54, "nonocarbon" should be deleted and --nanocarbon-- should be inserted.

In Claim 9:

Column 5, Line 4, "comprises" should be deleted and --additionally comprises-- should be inserted.

In Claim 14:

Column 6, Line 7, "the" should be deleted and --the nanocrystalline-- should be inserted.

In Claim 15:

Column 6, Line 13, "the" should be deleted and --the nanocrystalline-- should be inserted.

Signed and Sealed this
Third Day of January, 2017

Michelle K. Lee
*Director of the United States Patent and Trademark Office*